: US006179277B1

United States Patent
Huston et al.

(10) Patent No.: US 6,179,277 B1
(45) Date of Patent: Jan. 30, 2001

(54) LIQUID VAPORIZER SYSTEMS AND METHODS FOR THEIR USE

(75) Inventors: Joel M. Huston, San Jose; Fufa Chen, Cupertino, both of CA (US)

(73) Assignee: Applied Materials, Inc., Santa Clara, CA (US)

(*) Notice: Under 35 U.S.C. 154(b), the term of this patent shall be extended for 0 days.

(21) Appl. No.: 09/064,359

(22) Filed: Feb. 27, 1998

(51) Int. Cl.[7] .................................................. B01F 3/04
(52) U.S. Cl. .......................... 261/128; 261/156; 261/157
(58) Field of Search ................................. 261/128, 142, 261/152, 156, 157

(56) References Cited

U.S. PATENT DOCUMENTS

| | | | |
|---|---|---|---|
| 1,858,853 | * 5/1932 | Defrance et al. | 261/156 |
| 1,965,144 | * 7/1934 | Kane et al. | 261/156 |
| 3,901,182 | 8/1975 | Chiang | 118/49 |
| 4,044,077 | * 8/1977 | Gupta | 261/142 |
| 4,141,327 | * 2/1979 | Marcoux et al. | 261/142 |
| 4,177,778 | * 12/1979 | Naitou et al. | 261/142 |
| 4,212,663 | 7/1980 | Aslami | 65/144 |
| 4,450,823 | * 5/1984 | Abe et al. | 261/142 |
| 5,272,880 | 12/1993 | Nishizato et al. | 62/50.7 |
| 5,316,796 | 5/1994 | Awaya et al. | 427/252 |
| 5,440,887 | 8/1995 | Nishizato et al. | 62/50.7 |
| 5,451,258 | 9/1995 | Hillman et al. | 118/715 |
| 5,531,183 | 7/1996 | Sivaramakrishnam et al. | 117/93 |
| 5,672,385 | 9/1997 | Jimba et al. | 427/248.1 |
| 5,693,377 | 12/1997 | Westmoreland et al. | 427/582 |

FOREIGN PATENT DOCUMENTS

| | | | |
|---|---|---|---|
| 349383 | * 3/1922 | (DE) | 261/156 |
| 374737 | * 5/1923 | (DE) | 261/152 |
| 0548990A2 | 12/1992 | (EP) . | |
| 418754 | * 12/1910 | (FR) | 261/152 |
| 527360 | * 10/1921 | (FR) | 261/156 |
| 561750 | * 10/1923 | (FR) | 261/156 |
| 9784 | * 7/1916 | (GB) | 261/152 |

* cited by examiner

Primary Examiner—C. Scott Bushey
(74) Attorney, Agent, or Firm—Townsend and Townsend and Crew

(57) ABSTRACT

The present invention provides for improved liquid vaporizer systems and methods for their use. Vaporizer systems of the present invention are likely to be particularly useful for the vaporization of liquids having a relatively low vapor pressure, such as TDMAT. In one preferred embodiment, a liquid vaporizer system (10) includes a vaporizer unit (16) having first and second inlets (50 and 60) and an outlet (62). The vaporizer system further includes a vessel (22) having an inlet (70) and an outlet (72), whereby the vessel inlet is operably connected to the vaporizer outlet. The vessel contains a plurality of passages (78) which operably connect the vessel inlet and the vessel outlet. In this manner, liquids and/or gases flowing into the vaporizer unit through either or both of its two inlets, exit the vaporizer unit outlet and enter the vessel inlet. Liquids and/or gases pass through the plurality of passages and exit the vessel outlet. In this manner, heating vaporizer unit and vessel to desired temperatures results in the vaporization of the liquid, such as liquid TDMAT.

18 Claims, 8 Drawing Sheets

FIG. 4. _PRIOR ART_

LIQUID VAPORIZER SYSTEMS AND METHODS FOR THEIR USE

BACKGROUND OF THE INVENTION

The present invention is directed to liquid vaporizer systems and, more specifically, to liquid vaporizer systems for low vapor pressure liquids.

Semiconductor fabrication processes may include the use of chemical vapor deposition (CVD) to deposit a thin film of material on semiconductor wafers. CVD processes are often preferred because of their ability to provide highly uniform layers of film. CVD typically comprises introducing gases into a reaction chamber in the presence of a substrate, wherein the gases react and deposit a film on the substrate surface. Some of the CVD materials originate as liquids, and are evaporated and transported in the gaseous state to the desired reaction chamber for CVD.

Liquid reactant sources are often used with CVD processes. For example, titanium tetrachloride ($TiCl_4$) is used as a reactant gas in CVD to deposit titanium-containing film layers onto a substrate surface. Tetrakisdimethyl-amidotitanium (TDMAT), a metal-organic material, also is used in CVD processes.

CVD using $TiCl_4$ and TDMAT typically involves the vaporization of liquid $TiCl_4$ or TDMAT and the transportation of the gaseous $TiCl_4$ or TDMAT to the reaction chamber using a carrier gas. Care must be exercised to fully vaporize the liquid compound. If the compound is not fully vaporized and is thus delivered to the reaction chamber as a gas/liquid mixture, liquid compounds in the reaction chamber can lead to poor uniformity of the deposited film and other undesired process results. This also can cause poor repeatability wafer to wafer because liquid droplets deposited on the walls of the process piping can later evaporate, causing fluctuations in vapor concentration in the reaction chamber. Once fully vaporized, care also must be exercised to maintain the compound in a gaseous state while it is being transported to the reaction chamber. Condensation of $TiCl_4$ or TDMAT can lead to undesirable deposition process variability and possibly the failure of line components.

The vaporization of TDMAT presents unique problems, in part due to the fact that TDMAT has a low vapor pressure. It is desirable, therefore, to provide an efficient mechanism for fully vaporizing TDMAT metal-organic compound, and for transporting the gaseous compound to the reaction chamber while avoiding the condensation of TDMAT liquid out of the gas.

SUMMARY OF THE INVENTION

The present invention provides for improved liquid vaporizer systems and methods for their use. Vaporizer systems of the present invention are likely to be particularly useful for the vaporization of TDMAT and other liquid sources having relatively low vapor pressures. The present invention uses a two-step vaporization process to assist in the full vaporization of such liquids.

In one embodiment, a liquid vaporizer system of the present invention includes a vaporizer unit having first and second inlets and an outlet. The vaporizer system further includes a vessel having an inlet and an outlet, whereby the vessel inlet is operably connected to the vaporizer unit outlet. The vessel contains a plurality of passages which operably connect the vessel inlet with the vessel outlet. In this manner, liquids and/or gases flowing into the vaporizer unit through either or both of its two inlets exit the vaporizer unit outlet and enter the vessel inlet. Liquids and/or gases pass through the plurality of passages and exit the vessel outlet.

In one aspect, the first vaporizer inlet is adapted to receive a liquid and the second vaporizer inlet is adapted to receive a carrier gas. The vaporizer unit preferably comprises a control valve for controlling the amount of liquid passing therethrough, and a vaporization valve for causing the liquid which has passed through the control valve to be at least partially vaporized and transported out the vaporizer outlet by the carrier gas. A vaporizer passageway is provided which connects the control valve with the vaporization valve to allow liquid to flow from the control valve into the vaporization valve.

The vaporizer unit further preferably comprises a temperature-controlled housing structure containing both the control valve and the vaporization valve. A temperature control mechanism is in communication with the housing structure for maintaining a thermostatic condition inside the housing structure. In this manner, a desired amount of heat can be transmitted to the liquids or gases passing through the control valve and vaporization valve, thereby assisting with the vaporization of the liquid. Exemplary vaporizer units of the present invention are disclosed in U.S. Pat. No. 5,440,887 and U.S. Pat. No. 5,272,880, the complete disclosures of which are hereby incorporated by reference. Both U.S. Pat. No. 5,440,887 and U.S. Pat. No. 5,272,880 are assigned to Applied Materials, Inc. of Santa Clara, Calif., the assignee of the present application.

The vessel passages preferably have a cumulative surface area that is at least two times greater than, and more preferably, at least ten times greater than an internal surface area of an identical size vessel without the passages. The vessel preferably comprises at least five passages, and more preferably, at least 10 passages connecting the vessel inlet and outlet.

In one aspect, the vessel is generally cylindrical in shape. The vessel further preferably comprises a thermally conductive material. In one aspect, the vessel comprises stainless steel and, in another aspect, the vessel comprises aluminum. In addition, other thermally conductive materials, such as other metals or metal alloys, may be used.

The liquid vaporizer system further preferably comprises a heat source in communication with the vessel. In one aspect, the vessel heat sources comprises a blanket heater wrapped at least part way around the vessel. In this manner, an outer surface of the vessel can be heated to a desired temperature by the vessel heat source. Use of a thermally conductive material for the vessel facilitates the transmission of heat throughout the vessel structure, and to liquid and/or gas passing through the vessel to assist with vaporization.

In another aspect, the vaporizer system further comprises a gas passageway operably attached to the vessel outlet and adapted to be attached to a reaction chamber. In this manner, gases exiting the vessel outlet may be transported to a desired reaction chamber for CVD or other processes. The gas passageway is preferably an insulated, heated passageway to help maintain gases exiting the vessel outlet in a gaseous state.

In another aspect, the liquid vaporizer system further includes a preheater operably connected to at least one of the vaporizer inlets. Such a preheater is preferably used for preheating a carrier gas before the carrier gas enters the vaporizer unit. In this manner, the heated carrier gas facilitates the vaporization of a desired liquid, such as liquid TDMAT.

The present invention further provides a method for vaporizing liquid/gas mixtures. The method includes the step of flowing a liquid and a carrier gas into the vaporizer unit wherein the liquid is at least partially vaporized to create a liquid/gas mixture. The liquid/gas mixture is passed through a heated vessel wherein the liquid/gas mixture is further vaporized into a product gas.

In one aspect of the method, the liquid/gas mixture is passed through a plurality of generally parallel passages contained within the vessel. The passages preferably have a cumulative surface area that is at least two times greater than an internal surface area of an identical size vessel without the passages. The liquid preferably has a vapor pressure that is less than about 82 Torr at 100 degrees Celsius. In one aspect, the liquid comprises TDMAT, however, other liquids may be used within the scope of the invention. In another aspect, the carrier gas comprises helium, however, other inert gases, such as argon, nitrogen, or a combination of inert gases, may be used. In still another aspect, the liquid/gas mixture comprises at least some liquid TDMAT. The product gas preferably comprises gaseous TDMAT.

In one embodiment, the method further comprises the step of heating the vaporizer unit to a desired temperature, preferably, between about 50 degrees Celsius and about 200 degrees Celsius. In another aspect, the method further comprises the step of heating the carrier gas to a desired temperature, preferably between about 50 degrees Celsius and about 200 degrees Celsius, before the gas enters the vaporizer unit.

The method further preferably comprises the step of heating an outer surface of the vessel to a desired temperature. In one aspect, the vessel outer surface is heated to at least about 80 degrees Celsius. In another aspect, the vessel outer surface preferably is heated to between about 50 degrees Celsius and about 200 degrees Celsius. In this manner, the heated vessel facilitates further vaporization of any remaining liquid.

In still another aspect, the method further includes the step of passing the product gas through an insulated, heated passageway to prevent the condensation of liquid from the product gas. An outer surface of the heated passageway is preferably heated to between about 50 degrees Celsius and about 200 degrees Celsius.

In one embodiment of the present invention, an apparatus for vaporizing liquid/gas mixtures passing therethrough includes a vessel comprising a thermally conductive material, and having an inlet and an outlet. The inlet is operably connected to the outlet by a plurality of passages contained within the vessel. A heat source is in communication with the vessel for heating an outer surface of the vessel to a desired temperature. The passages have a cumulative surface area that is at least two times greater than an internal surface area of an identical size vessel without such passages. The vessel preferably comprises stainless steel and/or aluminum, however, other thermally conductive materials may be used within the scope of the present invention.

These and other features and advantages of the invention will appear from the following description in which the preferred embodiment has been set forth in detail in conjunction with the accompanying drawings.

DETAILED DESCRIPTION OF THE EMBODIMENTS

Figure 1:
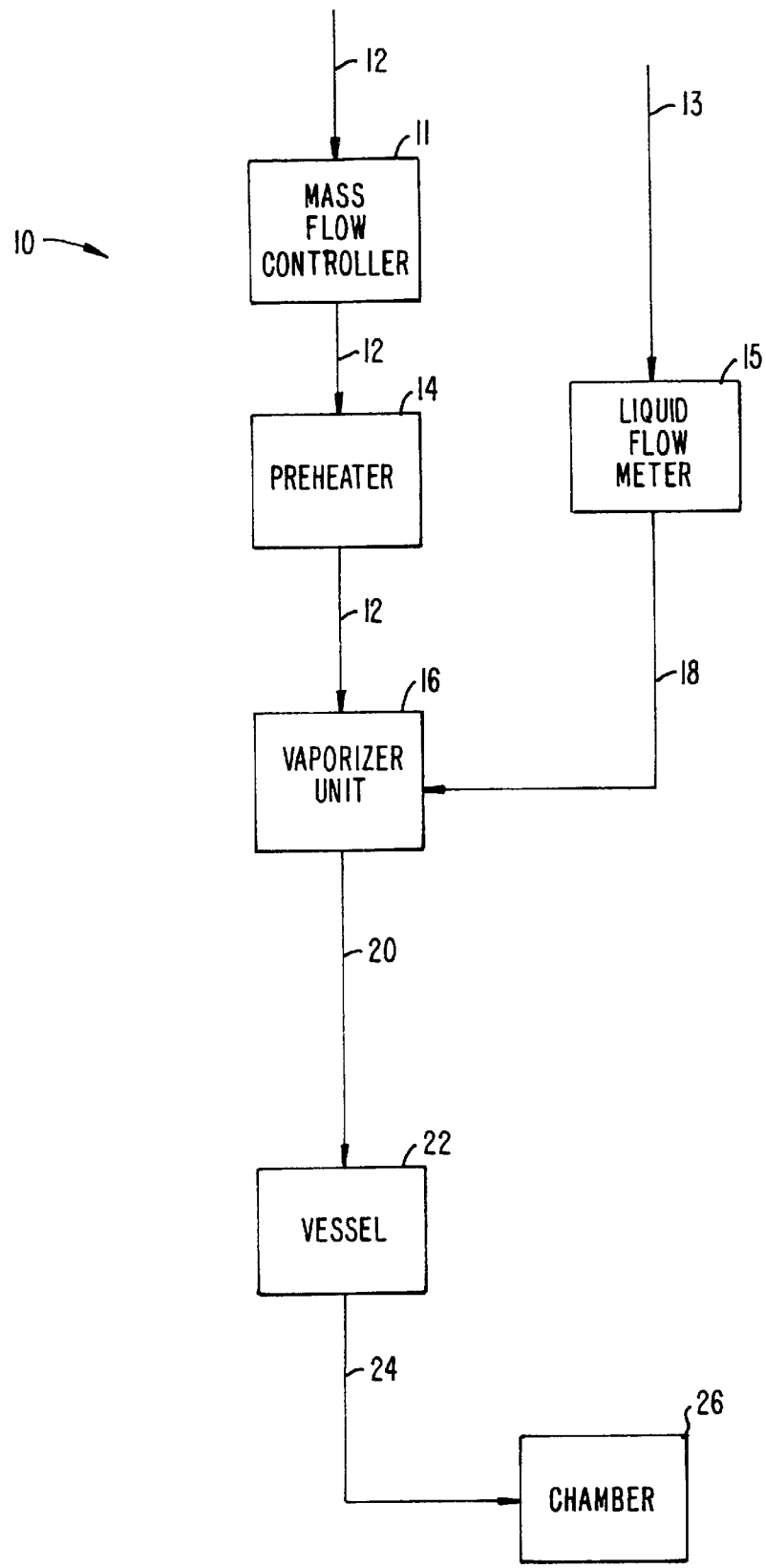
FIG. 1 is a schematic depiction of a liquid vaporizer system according to the present invention.

A liquid vaporizer system 10 according to the present invention will now be described. FIG. 1 depicts a schematic of liquid vaporizer system 10. Vaporizer system 10 includes a carrier gas line 12 through which a carrier gas such as helium, nitrogen, or the like is transported. For the vaporization of liquid TDMAT, the carrier gas is preferably a combination of inert gases, such as helium and nitrogen. Thus, the term carrier gas shall be understood to refer to an inert gas or a combination of inert gases. The desired carrier gas flows through a mass flow controller 11, which operates to control the amount of carrier gas flowing therethrough. The carrier gas is preheated in a preheater 14 and continues through carrier gas line 12 into a vaporizer unit 16.

A desired liquid, such as liquid TDMAT, flows through a liquid source line 13 and into and through a liquid flow meter 15. Liquid flow meter 15 operates to measure the amount of liquid flowing therethrough. The desired liquid enters a liquid line 18 and is delivered to vaporizer unit 16. Vaporizer unit 16, whose details will be described in conjunction with latter figures, at least partially vaporizes the TDMAT.

A liquid/gas mixture of TDMAT and the carrier gas exits vaporizer unit 16 through a liquid/gas mixture line 20 and enters a vessel 22 in which further vaporization of the TDMAT occurs as described in conjunction with latter figures. A product gas comprising gaseous TDMAT exits vessel 22 and proceeds through a product gas line 24 to a reaction chamber 26. Chemical vapor deposition or other desired processes involving gaseous TDMAT can then occur in reaction chamber 26.

Carrier gas line 12, liquid source line 13 and liquid line 18 may comprise stainless steel tubing or the like. Similarly, liquid gas mixture line 20 and product gas line 24 may comprise stainless steel tubing or the like. In one embodiment, lines 12, 13, 20 and 24 comprise ¼ inch diameter tubing, and line 18 comprises ⅛ inch diameter tubing.

The present invention further anticipates operably attaching preheater 14 to vaporizer unit 16 without the need to have carrier gas line 12 therebetween. Such a connection may be accomplished by fittings and joints, such as face sealed tubing or the like. Likewise, vaporizer unit 16 and vessel 22 may be operably attached to one another without the need to use liquid/gas mixture line 20.

Figure 2:
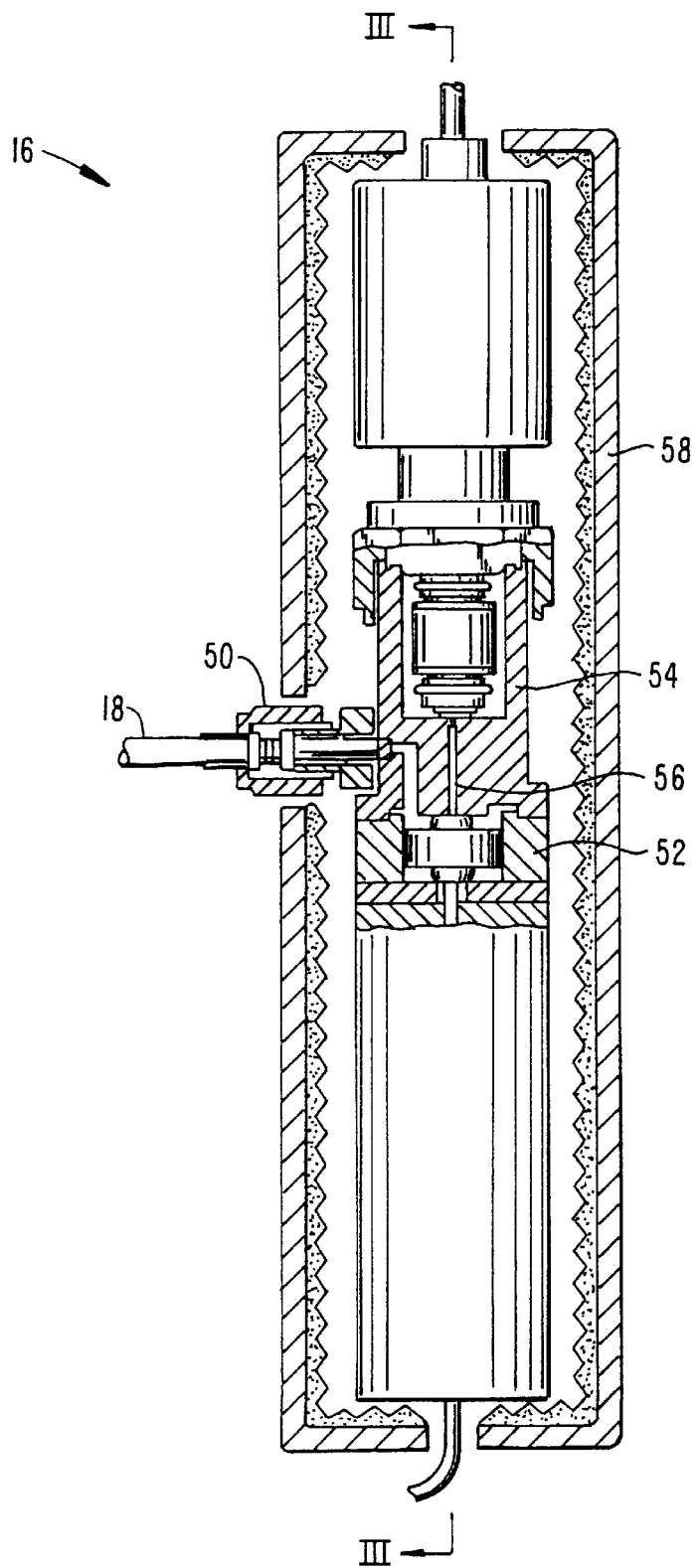
FIG. 2 is a front sectional view of a vaporizer unit according to the present invention.
Figure 3:
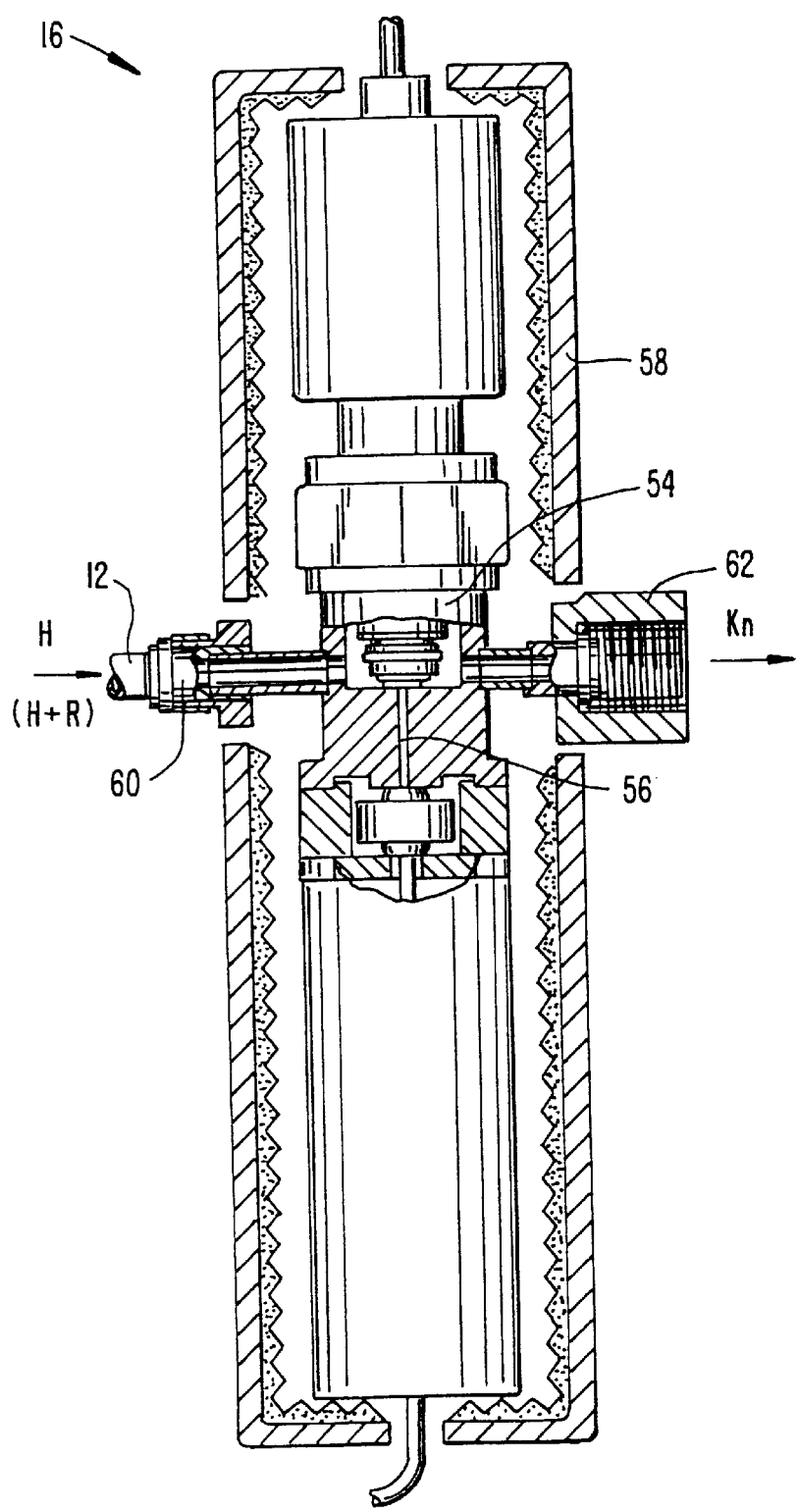
FIG. 3 is a sectional view of the vaporizer unit of FIG. 2 taken along line 3—3 in FIG. 2.

Turning now to FIG. 2, a preferred vaporizer unit 16 will be described. As shown in FIG. 2, vaporizer unit 16 comprises a liquid inlet 50 for receiving a desired liquid such as TDMAT. Liquid line 18 is operably connected to liquid inlet 50 to allow the transportation of liquid TDMAT to vaporizer unit 16. A control valve 52 operates to control the amount of liquid TDMAT passing therethrough. Liquid TDMAT proceeds through a vaporizer passageway 56 and into a vaporization valve 54. As best seen in FIG. 3, vaporizer unit 16 further includes a carrier gas inlet 60 as shown here operably attached to carrier gas line 12. As the carrier gas enters vaporizer unit 16, it proceeds into and through vaporization valve 54. The carrier gas transports at least partially vaporized TDMAT through vaporization valve 54 and a liquid/gas TDMAT mixture exits a vaporizer unit outlet 62.

Figure 4:
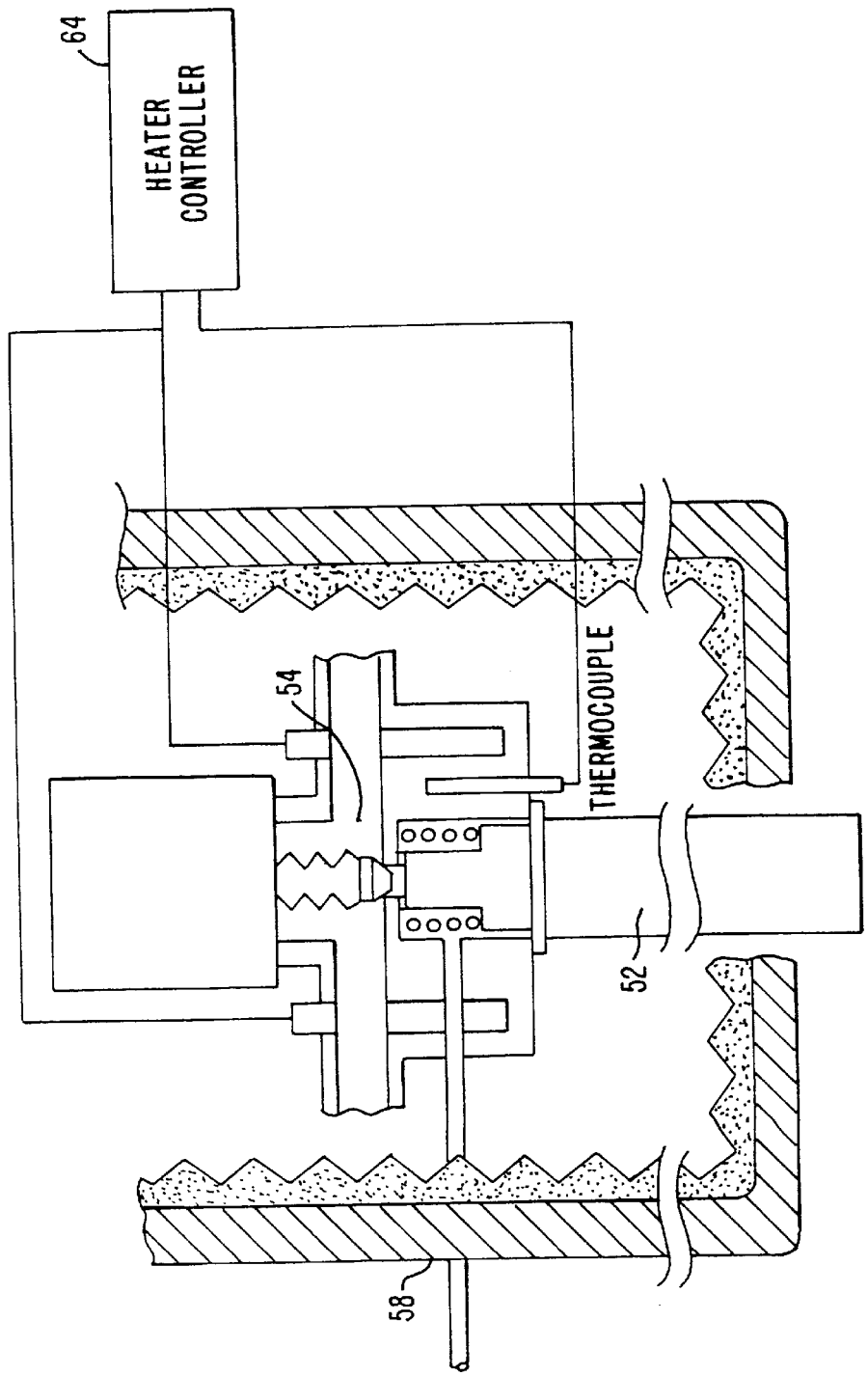
FIG. 4 is a schematic sectional view of the vaporizer unit of FIGS. 2 and 3 showing its temperature control mechanism.

FIGS. 2 and 3 depict a temperature-controlled housing structure 58 enclosing control valve 52 and vaporization valve 54. As seen in FIG. 4, a temperature control mechanism or heater controller 64 is operably attached to housing structure 58 to maintain a thermostatic condition inside housing structure 58. By controlling the temperature within housing structure 58, preferably at an elevated temperature between about 50 degrees Celsius and about 200 degrees Celsius, and more preferably, between about 70 degrees Celsius and about 90 degrees Celsius, TDMAT can be at least partially vaporized. Alternatively, TDMAT is at least partially vaporized by its contact with the carrier gas.

The preceding discussion in conjunction with FIGS. 2–4 describes a preferred embodiment of vaporizer unit 16 according to the present invention. A more detailed description is provided in U.S. Pat. No. 5,440,887 and U.S. Pat. No. 5,272,880, the complete disclosures of which have been previously incorporated by reference.

The preferred vaporizer unit 16 has experienced considerable success in vaporizing tetraethyl orthosilicate (TEOS, having a vapor pressure of about 82 Torr at 100 degrees celsius), and other materials. However, due in part to the fact that TDMAT has a low vapor pressure (about 9.1 Torr at 100 degrees Celsius), vaporizer unit 16 typically only partially vaporizes TDMAT. As previously described, the presence of partially vaporized TDMAT can provide undesirable characteristics in chemical vapor deposition processes.

In an attempt to fully vaporize TDMAT, consideration was given to heating liquid/gas mixture line 20 to a temperature sufficient to complete the vaporization of TDMAT. However, for mixture line 20 comprising a ¼ inch diameter tubing, this required heating the outer surface of such tubing to at least 115 degrees Celsius. At such a temperature, TDMAT breaks down into undesirable by-products which negatively affect the chemical vapor deposition process conducted in the reaction chamber. In addition, gas at this temperature may cause cracking of fittings, injection valves, and other line components. Therefore, at least part of the present invention is the realization that to provide full vaporization of TDMAT without increasing liquid/gas mixture line 20 temperature, and hence TDMAT temperature, to an undesirable level, TDMAT should be exposed to a larger heating surface at a lower temperature.

Figure 5:
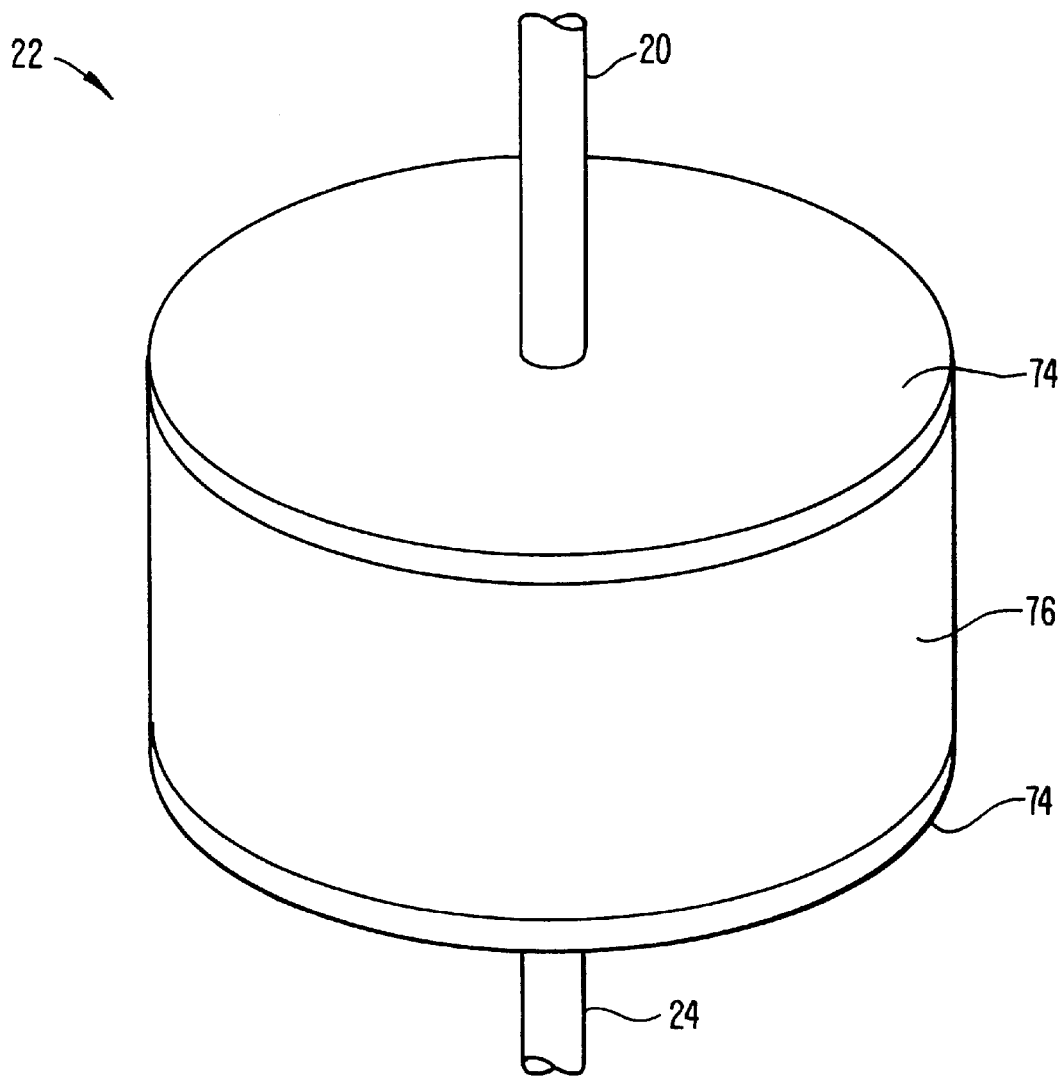
FIG. 5 is an overall view of a vessel that is part of a liquid vaporizer system according to the present invention.

Referring now to FIG. 5, a preferred vessel 22 of liquid vaporizer system 10 will now be described. Vessel 22 comprises inlet and outlet end caps 74 operably attached to a middle portion 76. The combination of end caps 74 and middle portion 76 results in vessel 22 having a cylindrical shape. Liquid/gas mixture line 20 is operably attached to vessel 22 in a manner which allows a liquid/gaseous TDMAT mixture to enter vessel 22. Product gas line 24 in turn is operably attached to vessel 22 to allow a product gas to exit vessel 22. Lines 20 and 24 can be operably attached to vessel 22 by a number of methods, including by the use of face sealed tubing or the like. As previously noted, vessel 22 also may be operably attached to vaporizer unit 16 without the need to use mixture line 20 therebetween.

Vessel 22 preferably comprises a thermally conductive material, and more preferably, stainless steel and/or aluminum. The choice of such a metal provides desirable thermal conductive properties to allow an external heat source to heat vessel 22 to a desired temperature. Vessel 22 may also comprise other thermally conductive materials, including other metals or metal alloys. Vessel 22 preferably comprises a disk-shaped or cylindrical vessel 22, although other shaped vessels are possible within the scope of the present invention. In one embodiment, vessel 22 preferably has a diameter that is between about one inch and about three inches, and a height that is between about one half inch and about two inches. Such a size and shape facilitates the incorporation of vessel 22 into exemplary mainframe units currently commercially available, including the Precision 5000®, the Centura® 5200, and the Endura® 5500 systems from Applied Materials, Inc. of Santa Clara, Calif.

Figure 6A:
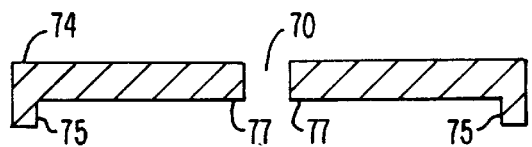
FIGS. 6a, b and c depict cross-sectional views of an inlet end cap, a middle portion, and an outlet end cap of the vessel depicted in FIG. 5, respectively.
Figure 6B:
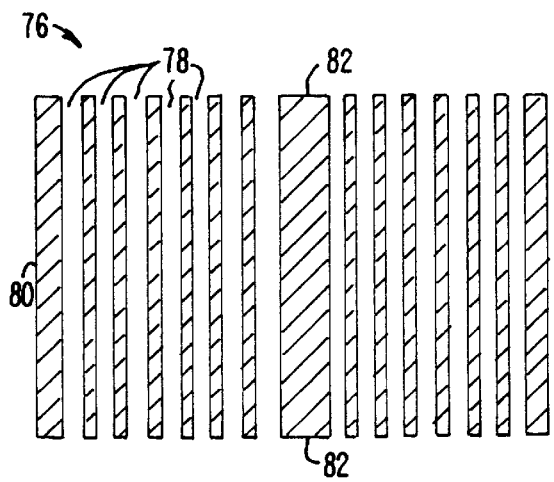
Figure 6C:
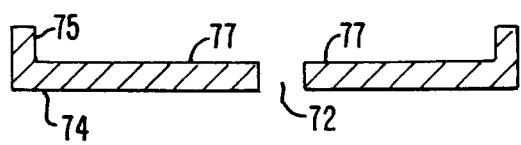

FIGS. 6a–6c show cross-sectional views of inlet and outlet end caps 74 and middle portion 76, taken through the middle thereof. As seen in FIGS. 6a and 6c, each end cap 74 has an outer cap rim 75 having a height that is greater than the height of the remainder of end cap 74. As a result, when end caps 74 are operably attached to middle portion 76, a small gap is created between an inner surface 77 of end caps 74 and the upper and lower surfaces of middle portion 76. Inlet end cap 74, to which liquid/gas mixture line 20 is operably attached, includes a vessel inlet 70 for receiving the liquid/gas mixture. Likewise, outlet end cap 74 is operably attached to product gas line 24 and has a vessel outlet 72 to allow a product gas to exit vessel 22. End caps 74 may be affixed to middle portion 76 by welding, adhesive or the like. Further, end caps 74 and middle portion 76 may be formed as a single piece of thermally conductive material.

Figure 7A:
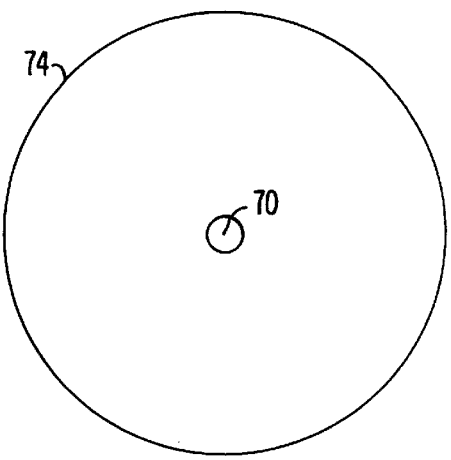
FIGS. 7a–c depict top planar views of the inlet end cap, the middle portion, and the outlet end cap of the vessel depicted in FIG. 5, respectively.
Figure 7B:
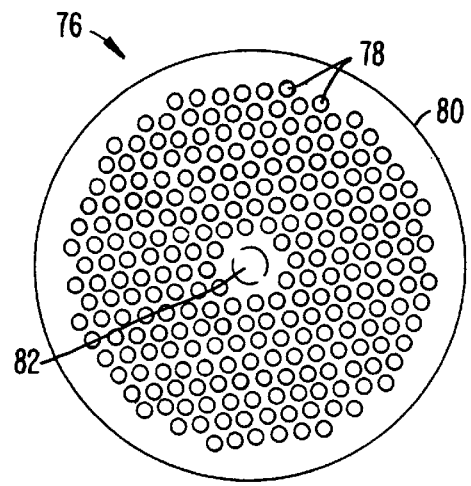
Figure 7C:
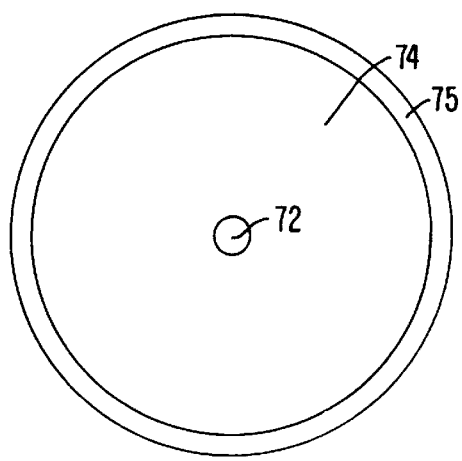

Middle portion 76 comprises an outer surface 80, a solid core 82 and a plurality of passages 78. Middle portion 76 may comprise a solid piece of thermally conductive material such as stainless steel, with passages 78 bored or drilled out therefrom. Alternatively, middle portion 76 may be formed or molded with passages 78, for example, by extruding a honeycomb-shaped structure to a desired length. As best seen in FIGS. 7a–7c, which depict top planar views of inlet and outlet end caps 74 and middle portion 76, a liquid/gas mixture entering vessel 22 enters vessel inlet 70. The liquid/gas mixture is unable to proceed directly through vessel 22 due to solid core 82. Instead, liquid/gas mixture proceeds through plurality of passages 78 and exits vessel 22 through vessel outlet 72.

By providing a plurality of passages 78 through which the liquid/gas TDMAT mixture proceeds, the liquid/gas mixture is exposed to a surface area that is larger than an internal surface area of vessel 22 if vessel 22 were a hollow vessel without such passages 78. Vessel 22 with a plurality of passages 78, therefore, exposes the liquid/gas TDMAT mixture to a larger heated surface area and any liquid TDMAT remaining in the liquid/gas mixture can be further vaporized. As a result, vessel outlet 72 allows a product gas to exit vessel 22 which preferably comprises fully vaporized TDMAT. As depicted in FIG. 7b, one preferred embodiment has passages 78 having circular cross-sections, however, the shape of passages 78 can be varied within the scope of the invention. Further, the number of passages 78 may be larger or smaller than the number of passages 78 depicted in FIG. 7B.

In one preferred embodiment, vessel 22 is cylindrical in shape and has a diameter of two inches and a height equal to one inch. Two hundred and forty-six (246) passages 78 are provided, each having a diameter of 0.081 inch. The passages 78 allow liquid/gas mixtures passing therethrough to be exposed to a surface area that is over 100 times greater than the surface area such mixtures would be exposed to in a one inch long, ¼ inch outer diameter (0.18 inch inner diameter) tubing.

Figure 8:
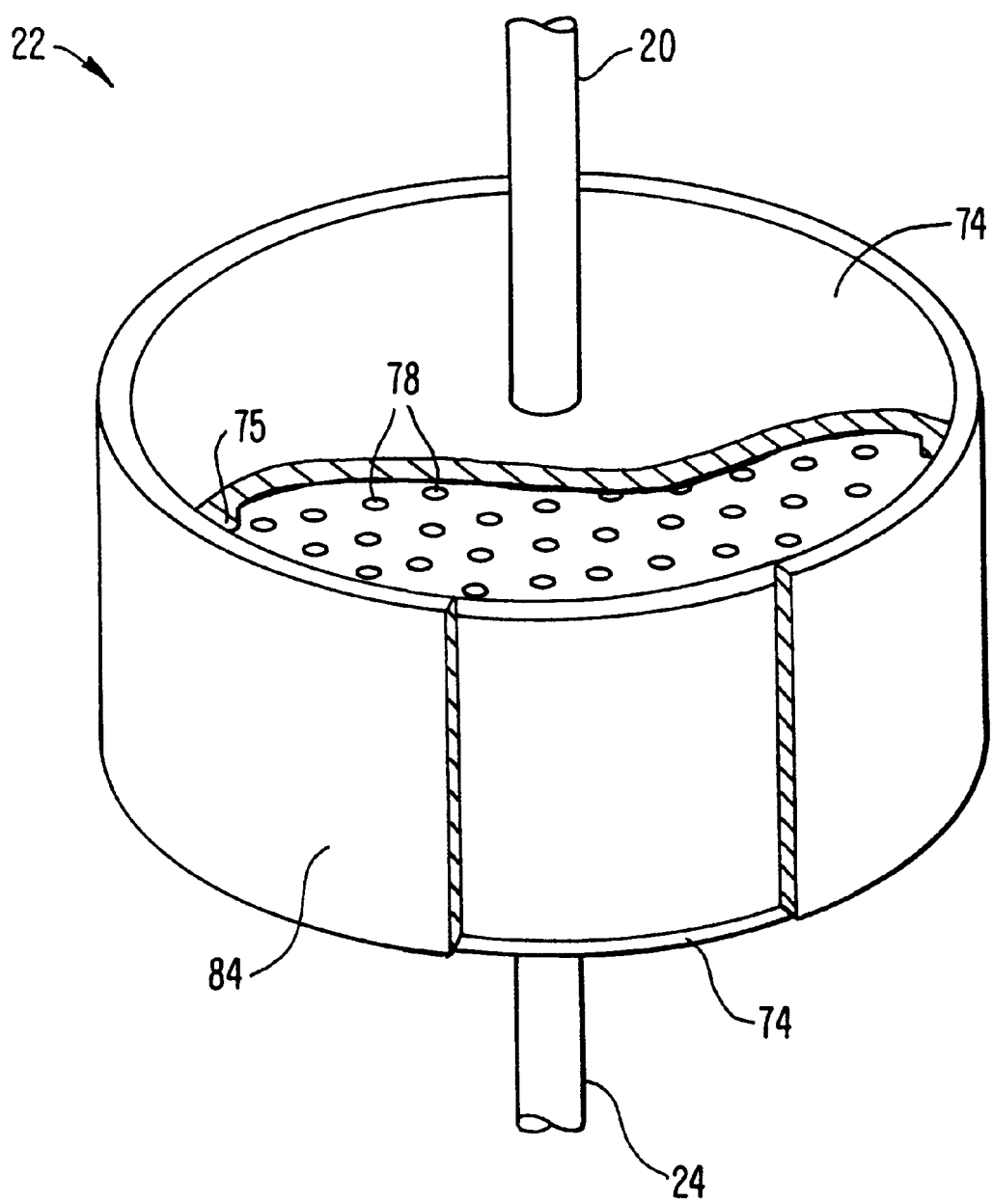
FIG. 8 is a partial cutaway view of the vessel depicted in FIG. 5 showing a blanket heater surrounding the vessel.

As seen in FIG. 8, a vessel heat source 84 preferably is operably attached to the outer surface of vessel 22. In this manner, vessel 22 outer surface preferably is heated to between about 50 degrees Celsius and about 200 degrees Celsius to assist with the vaporization of liquids. FIG. 8 depicts vessel heat source 84 as a blanket heater, however, other heat sources may be used. As previously noted, passing a liquid/gas mixture of TDMAT through the one quarter (¼) inch diameter tubing required that the outer surface of such tubing be heated to at least 115 degrees Celsius in order to fully vaporize the remaining liquid TDMAT. Use of vessel 22 having a larger surface area exposed to the liquid TDMAT allows vessel 22 to be heated to a lower temperature than the one quarter inch diameter tubing. For vaporization of TDMAT in the present invention, the outer surface of vessel 22 preferably is heated to between about 80 degrees Celsius and about 100 degrees Celsius, and more preferably, to about 95 degrees Celsius. By reducing vessel 22 temperature to about 95 degrees Celsius, TDMAT is no longer broken down into undesirable byproducts. As a result, a more homogeneous gaseous TDMAT is produced, thereby resulting in more favorable chemical vapor deposition processes. In addition, the lower temperature reduces the likelihood of cracking or other damage to line components.

Figure 9:
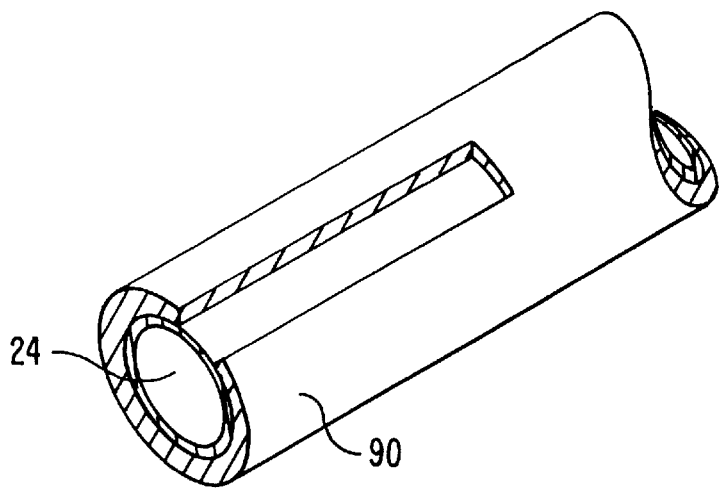
FIG. 9 is an overall view of an insulated, gas passageway as part of a liquid vaporizer system according to the present invention.

Turning now to FIG. 9 a gas passageway as part of the liquid vaporizer system 10 will be described. FIG. 9 depicts product gas line 24 surrounded by an electric resistance heater 90. Electric resistance heater 90 may comprise a blanket heater, although other heat sources may be used. Heater 90 is used to heat product gas line 24 to a desired temperature and to insulate line 24 in order to prevent the condensation of liquids, such as liquid TDMAT, on the internal surface of product gas line 24. Product gas line 24 preferably is heated to between about 50 degrees Celsius and about 200 degrees Celsius. As previously noted, the presence of liquid TDMAT is undesirable in chemical deposition processes and, therefore, the use of a heated insulated, product gas line 24 is desirable.

Figure 10A:
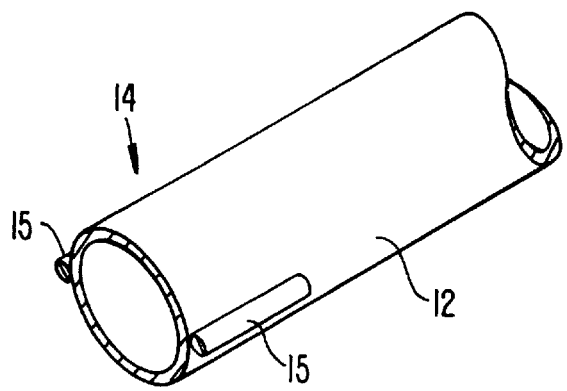
FIGS. 10a and b depict an overall view and a cross-sectional view, respectively, of a preheater as part of a liquid vaporizer system according to the present invention.
Figure 10B:
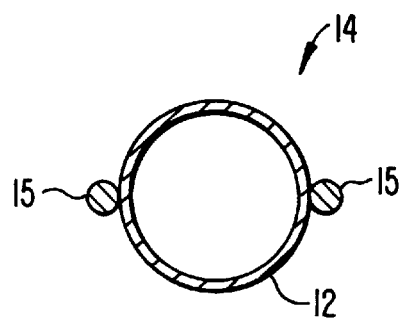

As previously discussed in conjunction with FIG. 1, carrier gas line 12 may preferably pass through a preheater 14. As shown in FIGS. 10a and 10b, preheater 14 can comprise heating elements 15 operably attached to the outer surface of carrier gas line 12. In this manner, the outer surface of carrier gas line 12 is heated, preferably to between about 50 degrees Celsius and about 200 degrees Celsius. As a result, carrier gas passing through carrier gas line 12 is at least partially heated. Alternatively, vessel 22 may be used as preheater 14. In this manner, carrier gas line 12 delivers a carrier gas to vessel 22, which heats the carrier gas passing therethrough as previously described. Carrier gas then flows into vaporizer unit 16 and a second vessel 22, which operate as previously described to vaporize a desired liquid, such as TDMAT.

Referring to FIG. 1, a method of vaporizing liquid/gas mixtures will now be described. A carrier gas, such as helium and/or nitrogen, is introduced into vaporizer unit 16, preferably after passing through mass flow controller 11 and preheater 14. A liquid, preferably liquid TDMAT, is introduced into vaporizer unit 16, preferably after passing through liquid flow meter 15. The liquid is at least partially vaporized in vaporizer unit 16 to create a liquid/gas mixture. The liquid/gas mixture is then passed through heated vessel 22, wherein the liquid/gas mixture is further vaporized into a product gas. Such further vaporization in heated vessel 22 is accomplished by passing the liquid/gas mixture through a plurality of passages as previously described.

In one preferred embodiment, the liquid comprises TDMAT and the carrier gas comprises a combination of helium and nitrogen. Preheater 14 is heated to a desired temperature that preferably is between about 90 degrees Celsius and about 120 degrees Celsius, which in turn heats the carrier gas passing through carrier gas line 12. Vaporizer unit 16 is heated to a desired temperature that preferably is between about 70 degrees Celsius and about 90 degrees Celsius, and the carrier gas and liquid TDMAT pass therethrough. A liquid/gas TDMAT mixture exits vaporizer unit 16 and passes through vessel 22. Vessel 22's outer surface is heated to a desired temperature that preferably is between about 80 degrees Celsius and about 100 degrees Celsius, and more preferably, is about 95 degrees Celsius. The product gas exiting vessel 22 is transported to chamber 26 through heated, insulated passageway 24. Passageway 24 is heated to a desired temperature that preferably is between about 80 degrees Celsius and about 110 degrees Celsius. As a result, liquid TDMAT is fully vaporized by passing through vaporizing unit 16 and vessel 22 at the preferred temperatures, and is transported in heated passageway 24 to chamber 26 in the gaseous state.

The invention has now been described in detail. However, it will be appreciated that certain changes and modifications may be made. For example, the present invention may be used with other liquids having a relatively low vapor pressure, such as triethylphosphate (TEPO) or liquids marketed under the trade name Cupra Select by Schumacher (a unit of Air Products and Chemicals, Inc.), located in Carlsbad, Calif. It is further understood that the liquid vaporizer systems and methods of the present invention can facilitate vaporization of other liquids having vapor pressures higher than that of TDMAT, such as liquid TEOS or $TiCl_4$. Therefore, the scope and content of this invention are not limited by the foregoing description. Rather, the scope and content are to be defined by the following claims.

What is claimed is:

1. A method of vaporizing liquid/gas mixtures comprising the steps of:

flowing a liquid and an inert carrier gas into a vaporizer unit, wherein said liquid is a low vapor pressure, metal-containing liquid that is at least partially vaporized to create a liquid/gas mixture; and passing said liquid/gas mixture through a heated vessel, wherein said liquid/gas mixture is further vaporized into a product gas.

2. A method as in claim 1, wherein said passing step comprises passing said liquid/gas mixture through a plurality of generally parallel passages contained within said vessel.

3. A method as in claim 2, wherein said plurality of passages have a cumulative surface area that is at least two (2) times greater than an internal surface area of an identical-sized vessel without said passages.

4. A method as in claim 1, wherein said liquid has a vapor pressure that is less than about 82 Torr at 100 degrees Celsius.

5. A method as in claim 1, wherein said metal-containing liquid comprises a titanium-containing liquid.

6. A method as in claim 5, wherein said titanium-containing liquid comprises TDMAT.

7. A method as in claim 1, wherein said carrier gas comprises helium.

8. A method as in claim 1, wherein said liquid/gas mixture comprises at least some liquid TDMAT.

9. A method as in claim 1, wherein said product gas comprises gaseous TDMAT.

10. A method as in claim 1, further comprising the step of heating said vaporizer unit to a desired temperature.

11. A method as in claim 10, wherein said vaporizer unit is heated to a desired temperature that is between about fifty (50) degrees celsius and about two hundred (200) degrees celsius.

12. A method as in claim 1, further comprising the step of heating said carrier gas to a desired temperature before introducing said carrier gas into said vaporizer unit.

13. A method as in claim 12, wherein said carrier gas is heated to a desired temperature that is between about fifty (50) degrees celsius and about two hundred (200) degrees celsius.

14. A method as in claim 1, further comprising the step of heating an outer surface of said vessel to a desired temperature.

15. A method as in claim 14, wherein said vessel outer surface is heated to a desired temperature that is at least about eighty (80) degrees celsius.

16. A method as in claim 14, wherein said vessel outer surface is heated to a desired temperature that is between about fifty (50) degrees celsius and about two hundred (200) degrees celsius.

17. A method as in claim 1, further comprising the step of passing said product gas through an insulated, heated passageway to prevent the condensation of liquid from said product gas.

18. A method as in claim 17, wherein an outer surface of said passageway is heated to a temperature that is between about fifty (50) degrees celsius and about two hundred (200) degrees celsius.

* * * * *